United States Patent
Shu et al.

(10) Patent No.: US 8,686,407 B2
(45) Date of Patent: Apr. 1, 2014

(54) TRANSPARENT DISPLAY APPARATUS WITH TRANSPARENT ELECTROLUMINESCENT DISPLAY UNIT

(75) Inventors: Fang-An Shu, Hsinchu (TW); Yao-Chou Tsai, Hsinchu (TW); Wen-Chung Tang, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/569,549

(22) Filed: Aug. 8, 2012

(65) Prior Publication Data

US 2013/0207099 A1    Aug. 15, 2013

(30) Foreign Application Priority Data

Feb. 13, 2012  (TW) .................. 101104532

(51) Int. Cl.
*H01L 27/32* (2006.01)

(52) U.S. Cl.
USPC ..................... 257/40; 257/E27.119

(58) Field of Classification Search
USPC ......... 257/59, 57, 72, 83, 257, 290, 351, 368, 257/392, E21.409, E21.41, E21.411, 257/E21.413, E21.414, E21.133, 43, 40, 257/E27.119
See application file for complete search history.

(56) References Cited

U.S. PATENT DOCUMENTS

| | | | |
|---|---|---|---|
| 6,674,245 B2 | 1/2004 | Ko et al. | |
| 7,385,347 B2 | 6/2008 | Song et al. | |
| 2001/0030507 A1 | 10/2001 | Ono | |
| 2005/0116659 A1 | 6/2005 | Kim et al. | |
| 2007/0145895 A1 | 6/2007 | Yamamoto et al. | |
| 2007/0170845 A1 | 7/2007 | Choi et al. | |
| 2007/0188082 A1 | 8/2007 | Kato et al. | |
| 2007/0296333 A1 | 12/2007 | Kim et al. | |
| 2008/0121872 A1 | 5/2008 | Choi et al. | |
| 2009/0220680 A1 | 9/2009 | Winters | |
| 2009/0278443 A1 * | 11/2009 | Terada et al. | ................. 313/504 |
| 2009/0309489 A1 | 12/2009 | Takata et al. | |
| 2009/0315458 A1 | 12/2009 | Choi et al. | |
| 2011/0003414 A1 | 1/2011 | Choi | |

* cited by examiner

*Primary Examiner* — Selim Ahmed

(74) *Attorney, Agent, or Firm* — WPAT, PC; Justin King

(57) ABSTRACT

A display apparatus includes a driving substrate and an organic light emitting diode device. The driving substrate includes a display area, a non-display area, a substrate and a transparent driving element. The transparent driving element is disposed in the non-display area to form a transparent region. The organic light emitting diode device is disposed over the driving substrate and located in the display area to form a non-transparent region.

9 Claims, 3 Drawing Sheets

TRANSPARENT DISPLAY APPARATUS WITH TRANSPARENT ELECTROLUMINESCENT DISPLAY UNIT

FIELD OF THE INVENTION

The present invention relates to an electroluminescent display unit and its applications, and more particularly to a transparent electroluminescent display unit of a transparent display apparatus and its applications.

BACKGROUND OF THE INVENTION

Since a transparent display apparatus itself contains a certain degree of light transmission, in addition to the original display function, the background behind the screen thus can be revealed. Such that, a transparent display apparatus can be applied to large-scale commercial demonstration and decoration of glass curtain walls, vehicle windows and shop windows. In terms of some design and performance aspects, the transparent display apparatus can show functions that many existing display technologies are difficult to achieve, hence it can be expected that the transparent display apparatus will replace parts of the existing display apparatuses in the future, and can be extensively applied to consumer electronic products, such as smart phones, notebook computers and portable electronic components.

An organic light emitting diode having advantages of simple processes, light, thin, flexible, colorful and a transparent self-luminous layer, has gradually become the main light source for producing the transparent display apparatus. In order to balance the injection carriers, transparent material of indium tin oxide (InSnO) with high work function is adopted by traditional organic light emitting diodes serving as the bottom anode electrodes. In addition, transparent or translucent material, mainly composed of InSnO, may be used to replacing the traditional metal layer to form a cathode electrode for purpose of enhancing its optical transmission property.

However, the cathode electrode mainly composed of transparent InSnO is difficult to be combined with the organic light emitting layer, such that the mass production technologies are still unable to be established. Moreover, traditional transparent display apparatus can simultaneously show images on both front side and back side. But this may bother the users who attach importance to privacy and don't want to show the contents displayed from the back side of the display apparatus.

Therefore, it is necessary to provide a transparent display apparatus with simple process, performing the functions of displaying images and revealing the background, as well as simultaneously taking the privacy of users into account.

SUMMARY OF THE INVENTION

One aspect of the present invention is to provide a display apparatus, wherein the display apparatus includes a driving substrate and an organic light emitting diode device. The driving substrate includes a display area, a non-display area, a substrate and a transparent driving element. The transparent driving element is disposed in the non-display area to form a transparent region. The organic light emitting diode device is disposed over the driving substrate and located in the display area to form a non-transparent region.

According to the aforementioned embodiments, a display apparatus including a driving substrate and an organic light emitting diode device is provided, wherein a transparent driving element is formed in a non-display area of the driving substrate by adopting chromium molybdenum (MoCr) thin layer and an InSnO layer to form conductive wires and electrodes of transparent thin film transistors (TFTs) involved in the transparent driving element, as well as by applying transparent oxide semiconductor material to form channel layers of the TFTs. Simultaneously, an organic light emitting diodes having an opaque cathode metal layer is adopted serving as a single-side light source and disposed in a display area of the driving substrate. As a result, the display apparatus can be essentially divided into a transparent area and a non-transparent area.

Because of the transparent area (which composed of the transparent driving element and the channel layers) allowing light passing there through, the background behind the screen thus can be revealed from the transparent area. Besides, since the image may be masked by the opaque cathode metal layer, thus the displayed images may not be observed from the back side of the display apparatus. Therefore, the privacy of users can be taken into account while the display apparatus performs the functions of image displaying and revealing the background behind the screen. Moreover, because the cathode metal layer which is competent to be easily combined with the organic light emitting layer of the organic light emitting diode is adopted, hence the display apparatus with the same elements is suitable for mass production.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention is to provide a transparent display apparatus including the functions of displaying image, revealing the background behind the screen and taking the privacy of users into account. In order to make the objects aforementioned and other purposes, features and advantages of the present invention to be more easily understood, the transparent electroluminescence display apparatus 10 is described as a preferred embodiment.

Figure 1A:
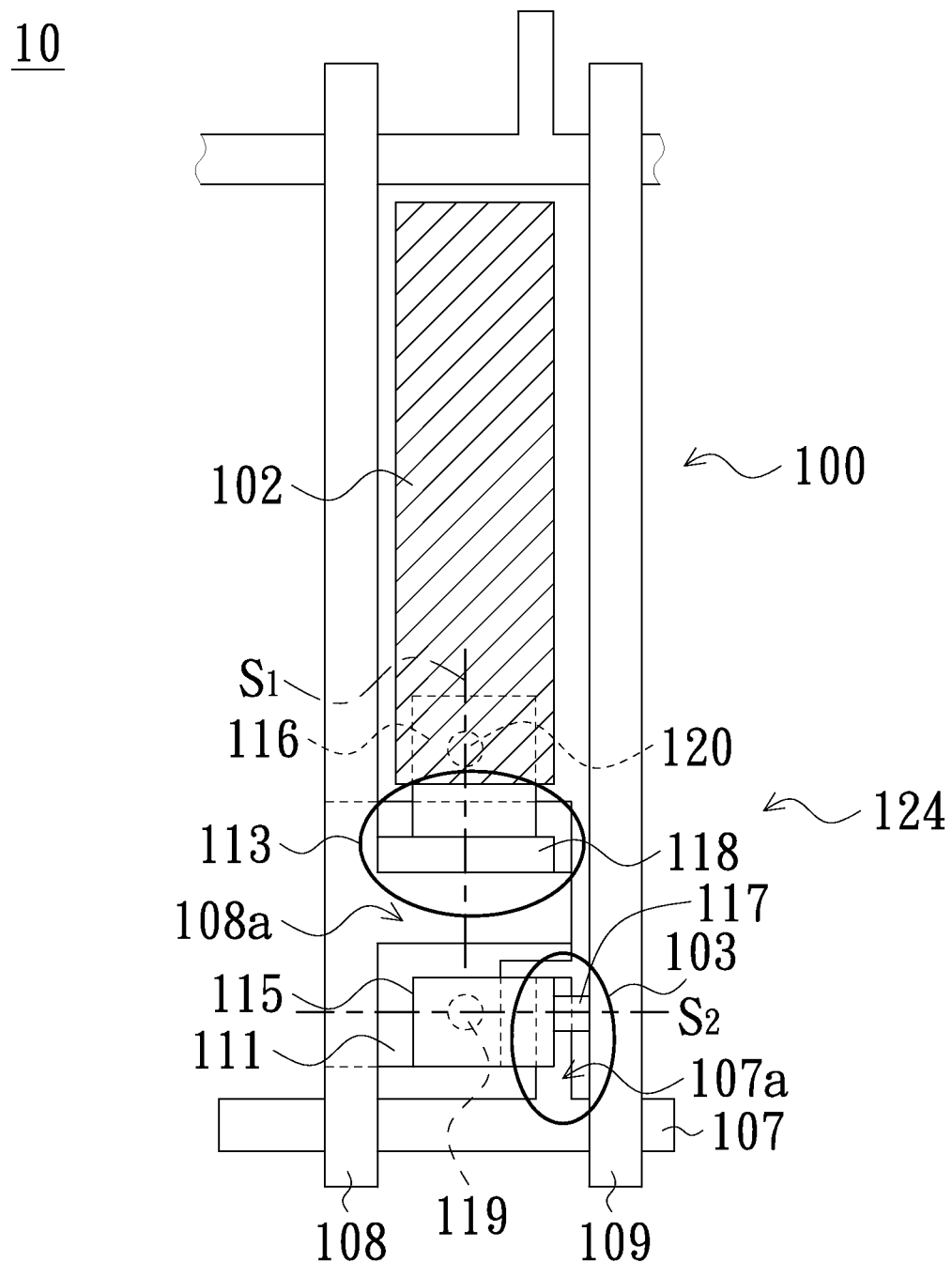
FIG. 1A is a schematic top-view for illustrating a portion of a transparent display apparatus in accordance with an embodiment of the present invention.
Figure 1B:
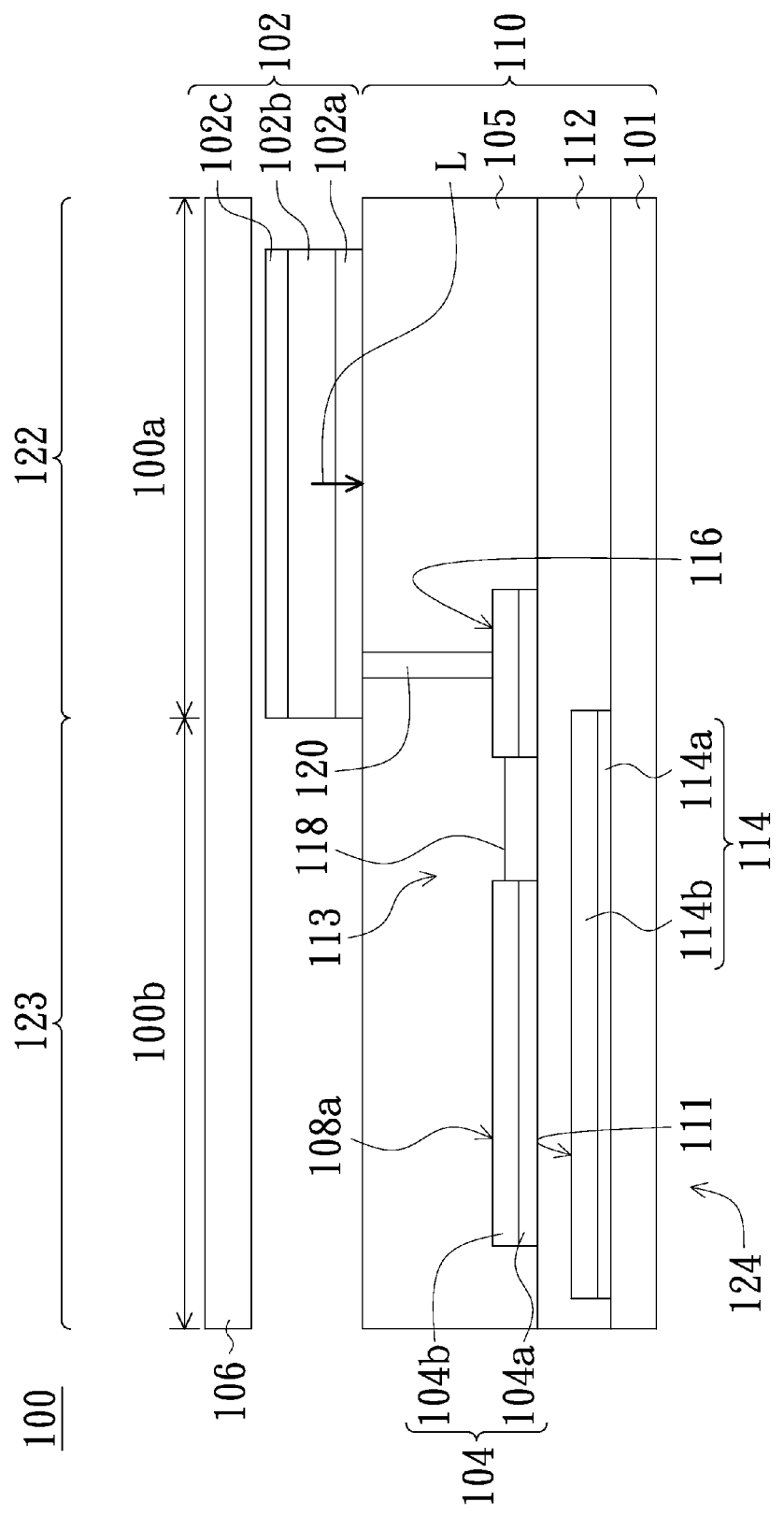
FIG. 1B is a cross-sectional view depicted along a section line S1 to illustrate a portion of the electroluminescent display unit as shown in FIG. 1A.
Figure 1C:
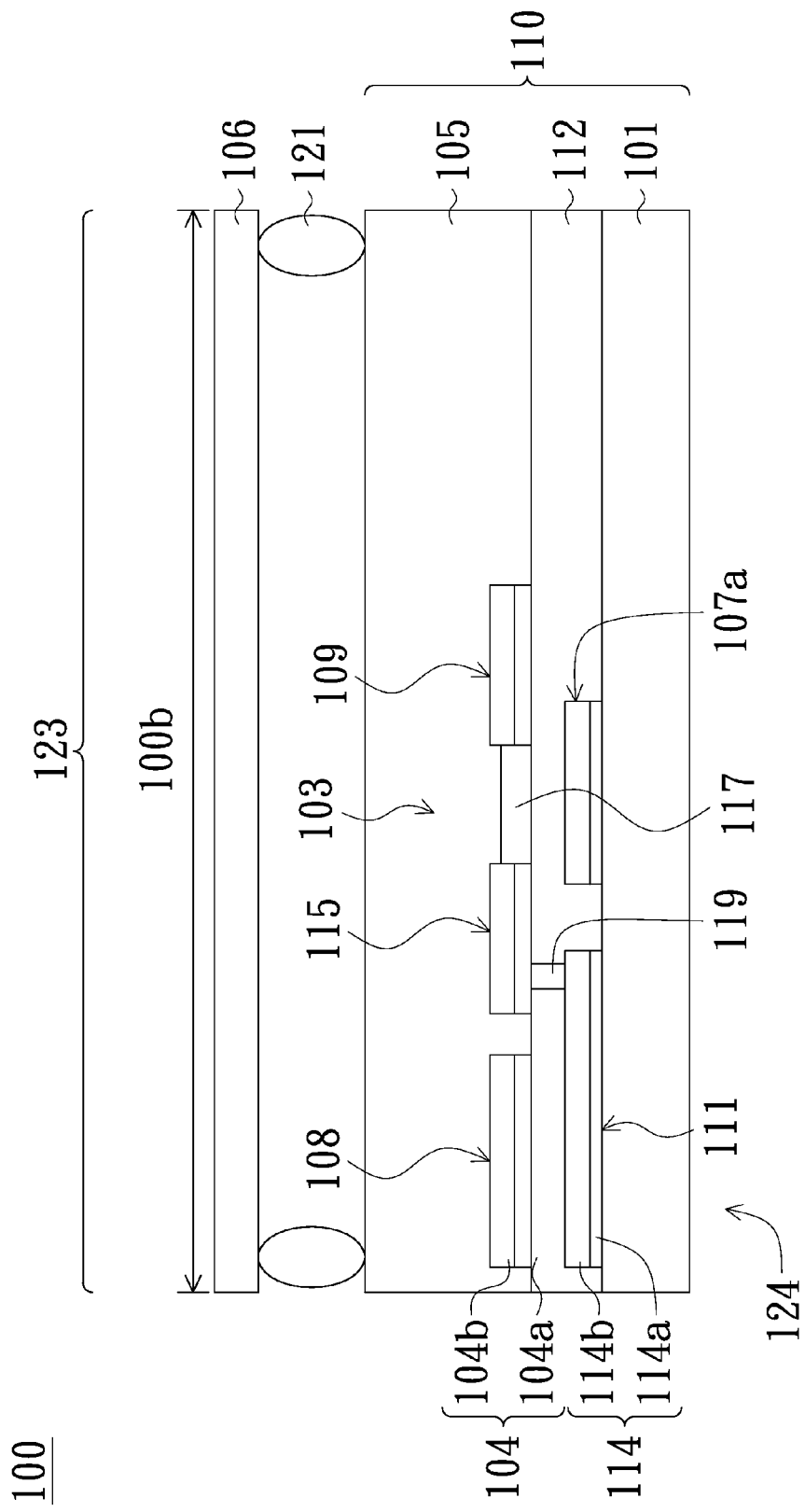
FIG. 1C is a cross-sectional view depicted along a section line S2 to illustrate a portion of the electroluminescent display unit as shown in FIG. 1A.

FIG. 1A is a schematic top-view for illustrating a portion of a transparent display apparatus 10 in accordance with an embodiment of the present invention. Typically, the transparent display apparatus 10 is constituted by a plurality of transparent electroluminescent display unit 100. However, for the convenience of description, only one single electroluminescence display unit 100 is depicted in FIG. 1A. FIG. 1B is a cross-sectional view depicted along a section line Si to illustrate a portion of the electroluminescent display unit 100 as shown in FIG. 1A; and FIG. 1C is a cross-sectional view depicted along a section line S2 to illustrate a portion of the electroluminescent display unit 100 as shown in FIG. 1A.

Each transparent electroluminescent display unit 100 includes a driving substrate 110 and an organic light emitting diode device 102. The driving substrate 110 can be divided into a display area 122 and a non-display area 123; and the driving substrate 110 includes a substrate 101 and at least one transparent driving element 124 disposed in the non-display area 123, wherein the transparent driving element 124 includes a plurality transparent TFTs, such as transparent TFTs 103 and 113, and a plurality transparent circuit layers, such as transparent circuit layers 104 and 114.

The transparent TFTs 103 and 113 and the transparent circuit layers 104 and 114 are disposed over the substrate 101 and covered with a passivation layer 105. The organic light emitting diode device 102 is disposed over the passivation layer 105. The passivation layer 105 and the organic light emitting diode device 102 are all covered with a protection layer 106. In order to keep the passivation layer 105 separated from the protection layer 106 for a constant distance, some spacers 121, for example, may be inserted between the passivation layer 105 and the protection layer 106.

The substrate 101 may be a semiconductor substrate (e.g. silicon substrate), or a flexible plasticized substrate. The passivation layer 105 and the protection 106 both are constituted by transparent materials. In other embodiment of the present invention, the material of the passivation layer 105 and the protection 106 may be a semiconductor material, such as silicon dioxide, silicon nitride and silicon oxynitride, plastic material, or other suitable transparent dielectric materials.

In one embodiment of the present invention, the electroluminescent display unit 100 includes at least two transparent circuit layers 104 and 114 which are sequentially stacked over the substrate 101 but not coplanar with etch other, wherein the two transparent circuit layers 104 and 114 are isolated from each other by an inner dielectric layer112 disposed there between. Besides, the two transparent circuit layers 104 and 114 are respectively electrical connected to the transparent thin film TFTs 103 and 113. The transparent circuit layer 104 preferably is a patterned conductive layer stacked by at least one chromium molybdenum (MoCr) thin layer 104a and at least one indium tin oxide (InSnO) layer 104b. The transparent circuit layer 114 is also a patterned conductive layer stacked by at least one MoCr thin layer 114a and at least one ITO layer 114b. The inner dielectric layer 112 is also constituted by transparent dielectric material, such as silicon dioxide, silicon nitride, silicon oxynitride, or other transparent dielectric material.

The transparent circuit layer 114 can be divided into a transparent scan line 107 and a transparent capacitance line (Cs line) 111; the transparent circuit layer 104 can be divided into a transparent date line 109, a transparent power supply line 108, and transparent electrodes 115 and 116. In the present embodiment, an extension part 107a of the transparent scan line 107, a portion of the transparent date line 109 and a portion of the transparent electrode 115 are overlapped, so as to constitute a transistor 103; and likewise, an extension part 108a of the transparent power supply line 108, a portion of the Cs line 111 and a portion of the transparent electrode 116 are overlapped so as to constitute a transistor 113 (see FIG. 1A). In addition, a capacitor (not shown) used to assist the operation of the transistor 113 may be constituted by the overlap of the Cs line 111 and another part of the transparent power supply line 108.

The transparent TFT 103 includes a transparent gate electrode constituted by the extension part 107a of the transparent scan line 107, a transparent source electrode constituted by a portion of the transparent date line 109, a transparent drain electrode constituted by a portion of the transparent electrode 115, a gate insulator layer constituted by a portion of the inner dielectric layer 112, and a semiconductor channel layer 117 (see FIG. 1C). The transparent TFT 113 includes a transparent gate electrode constituted by a portion of the transparent capacitance line 111, a transparent source electrode constituted by the extension part 108a of the power supply line 108, a transparent drain electrode constituted by a portion of the transparent electrode 116, a gate insulator layer constituted by a portion of the inner dielectric layer 112, and a semiconductor channel layer 118 (see FIG. 1B).

Furthermore, the aforementioned drain electrode (the transparent electrode 115) of the transparent TFT 103 is electrically connected to the transparent Cs line 111 by the interconnection line 119 penetrating through the inner dielectric layer 112; and the drain electrode (the transparent electrode 116) of the transparent TFT 113 is electrically connected to the organic light emitting diode device 102 by the interconnection line 120 penetrating through the passivation layer 105. The luminescence of the organic light emitting diode device 102 can be controlled by turning on or off the transparent TFT 103 and 113.

It is worth noting that both of the semiconductor channel layers 117 and 118 are made of transparent oxide semiconductor material including indium, gallium, zinc, or any combinations thereof. In some embodiments of the present invention, the oxide semiconductor material is selected from a group consisting of indium oxide (InO), gallium oxide (GaO), zinc oxide (ZnO), indium gallium zinc oxide (InGaZnO), gallium zinc oxide (GaZnO), indium gallium oxide (InGaO) and indium zinc oxide (InZnO). In the present embodiment, the preferred material used to constitute the semiconductor channel layers 117 and 118 is amorphous InGaZnO (a-IGZO).

The organic light emitting diode device 102 which is disposed in the display area 122 of the driving substrate 110 includes an anode layer constituted by a transparent electrode 102a, an organic electroluminescent layer 102b and a cathode layer constituted by an opaque metal layer 102c. The transparent electrode 102a (the anode layer) is formed over the passivation layer 105 and electrically connected to the drain electrode (the transparent electrode 116) of transparent TFT 113 by the interconnection line 120. The organic electroluminescent layer 102b is formed over the transparent electrode 102a by vapor deposition or roller printing (roll to roll). The opaque metal layer 102c is formed over the organic electroluminescent layer 102b.

In one embodiment of the present invention, the transparent electrode 102a is preferably, but not limited, made of ITO; the preferred material of the opaque metal layer 102c is preferably, but not limited, made of aluminum. Light initiated from the organic electroluminescent layer 102b can directly emit out by way of passing through the transparent electrode 102a, the passivation layer 105 and the substrate 101; or otherwise emit out indirectly by way of being reflected by the opaque metal layer 102c firstly and then passing through the transparent electrode 102a, the passivation layer 105 and the substrate 101 (shown as arrow L).

On one hand, because the organic light emitting diode device 102 includes an opaque metal layer 102c serving as a mask to prevent light passing trough the display area 122 of the driving substrate 110, such that a non-transparent area 100a can be defined in the display area 122. On the other hand, since the other elements (including the transparent driving element 124 including the transparent TFT 103 and the transparent circuit layer 104) located in the non-display area 123 are constituted of the transparent material, thus light is allowed passing through the driving substrate 110, and a transparent area 100b is relatively defined in the non-display area 123. As a result, the transparent electroluminescent display unit 100 can be substantially divided into a transparent area 100b and a non-transparent area 100a (shown in FIG. 1B).

In other words, although the transparent electroluminescent display unit 100 adopts the opaque metal cathode, it still retains a certain degree of light transmission. Thus, the transparent electroluminescent display unit 100 has both functions of displaying photo images and displaying the background behind the screen. Furthermore, the privacy of users can be taken account by using the opaque metal layer 102c serving as a mask to prevent the images from being observed from the back side of the display apparatus 10, as well as to prevent the image contents from being double-sided spied.

It is noteworthy that, nevertheless the MoCr thin layer, the InSnO layer and the oxide semiconductor material has light transmittance greater than 90% which can make the transparent area 100b have good optical transmission property, in a preferred embodiment of the present invention, the transparent TFT 103 and the transparent circuit layer 104 are generally disposed in the transparent area 100b, and not overlapping the organic light emitting diode device 102, in order to enhance the luminous efficiency of the organic light emitting diode device 102.

In sum, the embodiments of the present invention are to provide a display apparatus including a driving substrate and an organic light emitting diode device. On one hand, an organic light emitting diode device having an opaque cathode metal layer is disposed in the display area of the driving substrate serving as a single-side light source. On the other hand, MoCr thin layers and InSnO layers are used to form transparent wires and the electrodes of TFTs involved in the display apparatus; and transparent oxide semiconductor material is used to form the channel of the TFTs and the transparent driving element disposed in the non-display area of the driving substrate. Since the MoCr thin layers, the InSnO layers and the oxide semiconductor material have light transmittance greater than 90%, thus the portion of the display apparatus not being covered by the opaque organic light emitting diode device may have good optical transmission property. As a result, the display apparatus can be substantially divided into a transparent area and a non-transparent area.

Because the displayed images are masked by the opaque cathode metal layer, thus the image contents can not be observed from the back side of the display apparatus. Therefore, the privacy of users can be taken into account simultaneously while the display apparatus performs the functions of displaying images and revealing the background behind the screen. Moreover, it is no longer necessary adopting InSnO to form the cathode metal layer. Instead, a cathode metal layer competent to be easily combined with the organic light emitting layer of the organic light emitting diode is adopted. Such that, the process for forming the display apparatus can be simplified and thus is more suitable for mass production.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display apparatus, including:
   a driving substrate, including:
      a substrate;
      a display area;
      a non-display area; and
      a transparent driving element, disposed in the non-display area to form a transparent region, wherein the transparent driving element includes:
         a first transparent thin film transistor disposed over the substrate and electrically connected to the organic light emitting diode device;
         a plurality of transparent circuit layers disposed over the substrate and electrically connected to the first transparent thin film transistor; and
         a second transparent TFT disposed over the substrate and electrically connected to the first transparent thin film transistor and the transparent circuit layers; and
   an organic light emitting diode device, disposed over the driving substrate and located in the display area to form a non-transparent region.

2. The display apparatus according to claim 1, wherein the organic light emitting diode device includes:
   a transparent electrode disposed over the substrate;
   an organic electroluminescent layer disposed over the transparent electrode; and
   an opaque metal layer disposed over the organic electroluminescent layer.

3. The display apparatus according to claim 1, wherein the transparent circuit layers constitute a transparent circuit element having a transparent capacitor.

4. The display apparatus according to claim 3, wherein the transparent circuit element further includes a transparent thin film transistor, a transparent capacitor, a transparent power supply line, a transparent data line, a transparent scan line, a capacitance line or arbitrary combinations of thereof.

5. The display apparatus according to claim 1, wherein the driving substrate further includes:
   a passivation layer, covering the transparent driving element and disposed between the organic light emitting diode device and the transparent driving element; and
   a conductive wire, penetrating the passivation layer to electrically connect to the organic light emitting diode device and the first transparent thin film transistor.

6. The display apparatus according to claim 1, wherein each transparent circuit layer includes a chromium molybdenum (MoCr) thin layer and an indium tin oxide (InSnO) layer.

7. The display apparatus according to claim 1, wherein each of the first transparent thin film transistor and the second transparent thin film transistor includes:
   a transparent gate electrode disposed over the substrate;
   a transparent gate insulating layer disposed over the transparent gate electrode;
   a transparent source electrode disposed over the transparent gate insulating layer;
   a transparent drain electrode disposed over the transparent gate insulating layer and separated from the transparent source electrode; and
   a transparent channel layer disposed over the transparent insulating layer and in contact with the transparent source electrode and the transparent drain electrode.

8. The display apparatus according to claim 7, wherein each of the transparent gate electrode, the transparent source electrode and the transparent drain electrode includes a chromium molybdenum thin layer and an indium tin oxide layer;

and the transparent channel layer is composed of an oxide semiconductor material including indium, gallium, zinc, or arbitrary combinations of thereof.

9. The display apparatus according to claim 8, wherein the oxide semiconductor material is selected from a group consisting of indium oxide (InO), gallium oxide (GaO), zinc oxide (ZnO), indium gallium zinc oxide (InGaZnO), gallium zinc oxide (GaZnO), indium gallium oxide (InGaO) and indium zinc oxide (InZnO).

* * * * *